United States Patent
Sun et al.

(10) Patent No.: US 8,317,245 B2
(45) Date of Patent: Nov. 27, 2012

(54) MEMS-BASED MICRO AND NANO GRIPPERS WITH TWO-AXIS FORCE SENSORS

(76) Inventors: Yu Sun, Toronto (CA); Keekyoung Kim, Toronto (CA)

(*) Notice: Subject to any disclaimer, the term of this patent is extended or adjusted under 35 U.S.C. 154(b) by 608 days.

(21) Appl. No.: 12/305,468

(22) PCT Filed: Jun. 21, 2007

(86) PCT No.: PCT/CA2007/001090
§ 371 (c)(1),
(2), (4) Date: Dec. 18, 2008

(87) PCT Pub. No.: WO2007/147239
PCT Pub. Date: Dec. 27, 2007

(65) Prior Publication Data
US 2010/0207411 A1    Aug. 19, 2010

(30) Foreign Application Priority Data
Jun. 23, 2006 (CA) .................................. 2551191

(51) Int. Cl.
*B25J 7/00* (2006.01)
(52) U.S. Cl. ......... 294/86.4; 294/213; 294/907; 901/34; 901/46
(58) Field of Classification Search .............. 294/86.4, 294/192, 196, 213, 219, 907; 977/962; 901/33, 901/34, 36, 46
See application file for complete search history.

(56) References Cited

U.S. PATENT DOCUMENTS

| 4,667,997 A * | 5/1987 | Udagawa et al. ............ 294/86.4 |
| 4,982,611 A * | 1/1991 | Lorenz et al. ............ 73/862.043 |
| 5,004,391 A * | 4/1991 | Burdea ............................. 414/6 |
| 5,046,773 A * | 9/1991 | Modesitt ....................... 294/100 |
| 5,651,574 A * | 7/1997 | Tanikawa et al. ............ 294/86.4 |
| 6,183,097 B1 * | 2/2001 | Saif et al. ..................... 359/871 |
| 7,322,622 B2 * | 1/2008 | Hashiguchi et al. ......... 294/86.4 |
| 7,431,364 B2 * | 10/2008 | Huang et al. ................. 294/99.1 |
| 7,849,515 B2 * | 12/2010 | Hashiguchi et al. ........... 850/18 |
| 2002/0061662 A1 * | 5/2002 | Boggild ......................... 438/800 |
| 2003/0201654 A1 * | 10/2003 | Ellis .......................... 294/119.1 |

FOREIGN PATENT DOCUMENTS
EP    0696497    *    2/1996

OTHER PUBLICATIONS

"A Four Degree of Freedom MEMS Microgripper with Novel Bi-Directional Thermal Actuators" document. Greminger et al., dated Aug. 2005.*
"Travel Range Extension of a MEMS Electrostatic Microactuator" document. Piyabongkarn et al., dated Jan. 2005.*

* cited by examiner

*Primary Examiner* — Dean Kramer

(57) ABSTRACT

The present invention relates to a design and microfabrication method for microgrippers that are capable of grasping micro and nano objects of a large range of sizes and two-axis force sensing capabilities. Gripping motion is produced by one or more electrothermal actuators. Integrated force sensors along x and y directions enable the measurement of gripping forces as well as the forces applied at the end of microgripper arms along the normal direction, both with a resolution down to nanoNewton. The microfabrication method enables monolithic integration of the actuators and the force sensors.

12 Claims, 3 Drawing Sheets

A - A

B - B

MEMS-BASED MICRO AND NANO GRIPPERS WITH TWO-AXIS FORCE SENSORS

PRIORITY

This application claims the benefit of Canadian Patent No. 2,551,191, filed 23 Jun. 2006.

FIELD OF THE INVENTION

The present invention relates to micro and nanosystems, and micro and nanotechnology.

BACKGROUND OF THE INVENTION

Intelligent manipulation (e.g., grasping/gripping) of micro- and nanometer-sized objects requires the use of miniaturized microgrippers with integrated force sensors. Currently, micro- and nanomanipulation typically relies purely on visual feedback either from an optical microscope or an electron microscope. The lack of force feedback at the microNewton and nanoNewton level severely limits intelligent micro- and nanomanipulation.

Besides miniaturization and electrical control, microgrippers must be capable of providing multi-axis force feedback to satisfy the following requirements: (i) to protect the microgripper and detect the contact between the microgripper and the object to be manipulated; and (ii) to provide gripping force feedback during grasping to obtain secured grasping while protecting the object to be grasped.

The vast majority of existing microgrippers lack force feedback due to the difficulty of integrating force sensors with microgrippers. The lack of force feedback does not permit force-controlled manipulation and easily causes breakage of microgrippers and damage to the object to be manipulated.

A recently reported electrothermally driven microgripper design is integrated with a single-axis piezoresistive force sensor that is only capable of measuring gripping forces. (See K. Molhave and O. Hansen, "Electrothermally actuated microgrippers with integrated force-feedback," *J. of Micromechanics and Microengineering*, 15(6), pp. 1265-1270, 2005.) However, the gripping force sensing resolution is somewhat poor, on the order of milli-Newton that is orders of magnitude worse than what micro-nanomanipulation requires.

A recent paper reports a design of an electrostatically driven microgripper with a single-axis capacitive force sensor that is only capable of measuring gripping forces. (See F. Beyeler, D. J. Bell, B. J. Nelson, Yu Sun, A. Neild, S. Oberti, and J. Dual, "Design of a micro-gripper and an ultrasonic manipulator for handling micron sized objects," IEEE/RSJ International Conference on Intelligent Robots and Systems, Beijing, China, October, 2006.) Due to the limitation of electrostatic actuation (low force output, small displacements, and high driving voltage), the microgripper design is only capable of grasping objects of a small range of sizes.

The lack of force sensing capabilities along a second-axis down to nanoNewton in existing designs does not allow for the protection of microgrippers and the detection of contact between the microgripper and object to be manipulated. What is needed is design and microfabrication of microgrippers that are capable of grasping micro and nano objects of a large range of sizes and having two-axis force sensing capabilities.

SUMMARY OF THE INVENTION

In one aspect, the present invention employs MEMS (microelectromechanical systems) technology in the design and microfabrication of microgrippers that are capable of grasping micro and nano objects of a large range of sizes and two-axis force sensing capabilities.

In an embodiment of the present invention, integrated, single-chip, batch microfabricated MEMS devices are disclosed that are electrothermally-driven microgrippers with integrated dual-axis force sensing capabilities. The gripping motion is produced by an actuator, such as a bent-beam actuator. The bent-beam actuator requires little power and is capable of producing a large range of gripping forces and displacements. Integrated force sensors along the in-plane x and y directions using transverse differential capacitive comb drives enable the measurement of gripping forces as well as the forces applied at the end of microgripper arms along the normal direction, both with a resolution down to nanoNewton.

In another aspect, a microfabrication process for a microgripper is provided.

This microgripper design features two-axis force sensing capabilities suitable for use in intelligent micro and nanomanipulation. Additionally, the employment of bent-beam electrothermal microactuators permits the grasping of objects of a large range of sizes.

BRIEF DESCRIPTION OF THE DRAWINGS

A detailed description of one or more embodiments is provided herein below by way of example only and with reference to the following drawings, in which.

Figure 1:
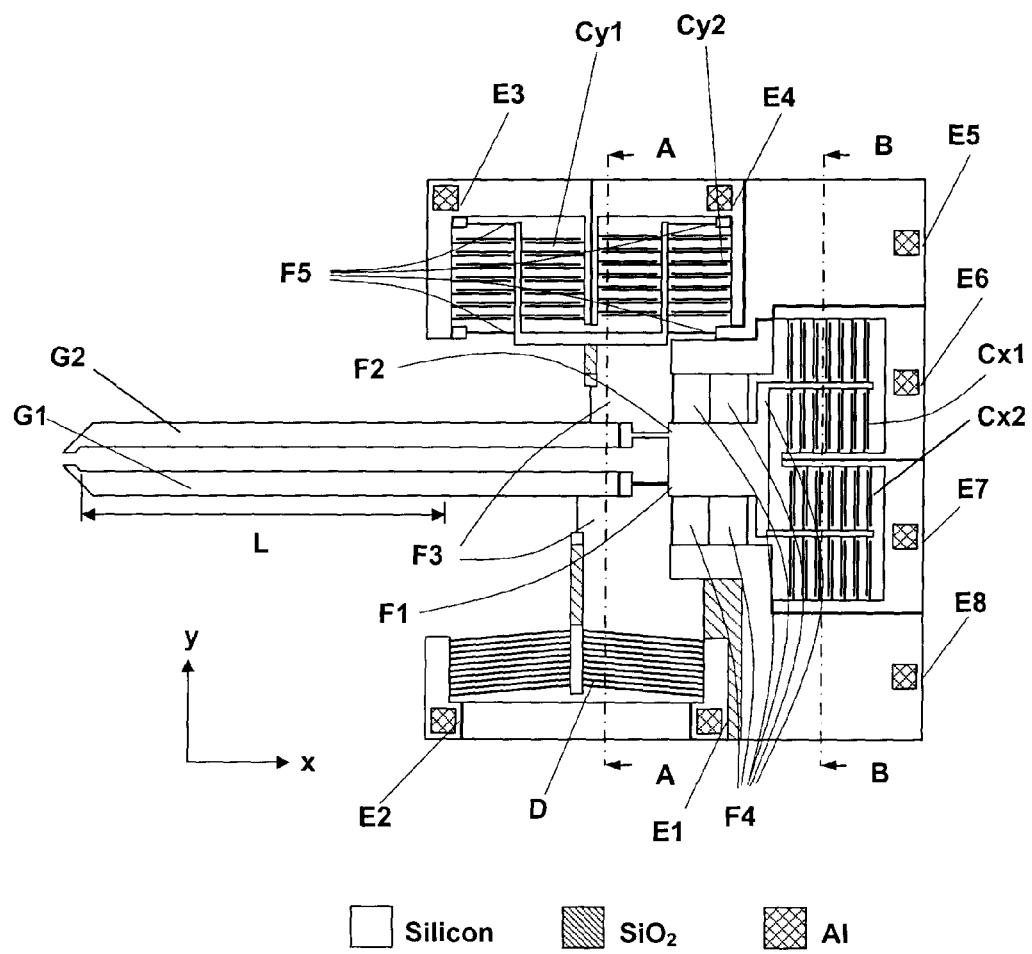
FIG. 1 illustrates a microgripper with integrated dual-axis capacitive force sensors.

In the drawings, one or more embodiments of the present invention are illustrated by way of example. It is to be expressly understood that the description and drawings are only for the purpose of illustration and as an aid to understanding, and are not intended as a definition of the limits of the present invention.

DETAILED DESCRIPTION OF THE INVENTION

In an embodiment of the present invention, an electrothermally actuated microgripper comprises four parts, as illustrated in FIG. 1: (i) electrothermal microactuator D to drive gripper arm G1; (ii) driving arm G1 and sensing arm G2 used together to grasp micro/nano objects; (iii) linear beam flexures F1, F2, F3, F4, and F5 used to transform forces into displacements; and (iv) pairs of capacitor plates forming capacitors Cx1, Cx2, Cy1, and Cy2 to transform displacements into capacitance changes.

In this case, the electrothermal microactuator D is a bent-beam microactuator. However, it should be understood that other types of electrothermal actuators are possible and within the scope of the present invention, such as U-beam electrothermal actuators or electrostatic actuators, for example. It should also be understood that piezoresistive force sensors could be used instead of capacitive force sensors.

Electrothermal bent-beam microactuator D produces forces to deflect the microgripper arm G1 through flexure F3. When electrothermal forces are produced by applying voltages/current between electrodes E1 and E2, the translational movement of F3 is converted into a rotational movement of the driving arm G1. The displacement and driving force from a single bent-beam of the electrothermal microactuator are $$U = \alpha \Delta T l_d \frac{\sin\theta}{\left(\sin^2\theta + \cos^2\theta \frac{12 l_d}{A_d l_d^2}\right)}$$

$$F_d = \alpha \Delta T E A_d \frac{\cos\theta}{\left(\sin^2\theta \frac{A_d l_d^2}{12 l_d} + \cos^2\theta\right)}$$

where $\alpha$ is the coefficient of thermal expansion of the beam material, E is Young's modulus, $I_d$ is the beam length, $A_d$ is the beam cross sectional area, $I_d$ is the moment of inertia, and $\theta$ is the bending angle of bent beams. The bending of flexure F1 increases the reaction force of G1; however, this contribution from the bending of flexure F1 is trivial and thus, can be neglected. The displacement of the end of G1 is amplified by an amplification factor from the displacement of the bent-beam microactuator.

The second microgripper arm G2 is supported by flexures F2 and F5 and is connected to the capacitive force sensor Cy1 and Cy2. G2 transmits gripping forces to the movable capacitor plates of the transverse comb drive Cy1 and Cy2 that together form a differential comb drive. As a gripping force $F_g$ is applied, flexure F5 is deformed and the capacitance change of Cy1 and Cy2 can be measured through electrodes E3, E4, and E5. The bending force of flexure F2 converts the rotational motion of G2 into a translational displacement that is small and can be neglected.

$$F_g = 4 \frac{E t w_g^3}{l_g^3} x$$

where l is the length of the flexures F5, t is the out-of-plane thickness, $w_g$ is the in-plane width, and x is the deflection. The capacitance C for each comb drive is $$C = \frac{\varepsilon_0 n A}{d}$$

where $\varepsilon_0$ is the dielectric constant, n the number of capacitor plate pairs, A is the overlapping area, and d is the gap distance. Changing the gap d instead of the overlapping area A provides a high change of capacitance for a small displacement $\Delta d$ and thus increases the resolution of force sensing.

When the microgripper approaches a micro object, it is difficult to detect from pure visual feedback the contact between the microgripper arms and the substrate. Thus, x-directional (i.e. longitudinal) force feedback is necessary for contact detection and to avoid the breakage of the microgripper. In addition, the x-directional force feedback can also be used to measure the tensile strength or adhesion force, such as biological cells sticking on a substrate by gripping and pulling. As flexures F3 and F4 are deflected, capacitance changes Cx1 and Cx2 are measured through electrodes E6, E7 and E8. Cx1 and Cx2 together form a differential comb drive.

Flexures F1 and F2 are designed to be deformed in the y-direction and translate forces in the y-direction (i.e. lateral direction). In contrast, flexure F3 is designed to be deformed in the x-direction and translate forces in the x-direction. Besides serving as flexures, F4 and F5 are also used for electrical signal routing. Flexure F5 must be such designed that it has a high enough stiffness in the x-direction to protect Cy1 and Cy2 from the rotational motion of gripper arms G1 and G2.

In order to obtain a linear relationship between force/displacement and capacitance/voltage changes, differential comb drive structures are used for Cx and Cy $$Cx1 = \varepsilon_0 \frac{A_x}{d_1 - x} + \varepsilon_0 \frac{A_x}{d_2 + x}, Cx2 = \varepsilon_0 \frac{A_x}{d_1 + x} + \varepsilon_0 \frac{A_x}{d_2 - x}$$

$$Cy1 = \varepsilon_0 \frac{A_y}{d_1 - y} + \varepsilon_0 \frac{A_y}{d_2 + y}, Cy2 = \varepsilon_0 \frac{A_y}{d_1 + y} + \varepsilon_0 \frac{A_y}{d_2 - y}$$

where $d_1$ is the smaller gap and $d_2$ is the larger gab between two capacitive plates along the x and y-direction, x is the deflection in x-direction, y is the deflection in the y-direction, and Ax and Ay are the overlapping area. The capacitor plates of the capacitors Cx1 and Cx2 are oriented parallel to the xz-plane. The capacitor plates of the capacitor Cy1 and Cy2 are oriented parallel to the yz-plane. To determine the gripping force $F_g$, the deflection of flexure F5 in the y-direction is measured via Cy1 and Cy2. To determine the force Fx to the normal direction of microgripper arms, Cx1 and Cx2 are measured.

Figure 2:
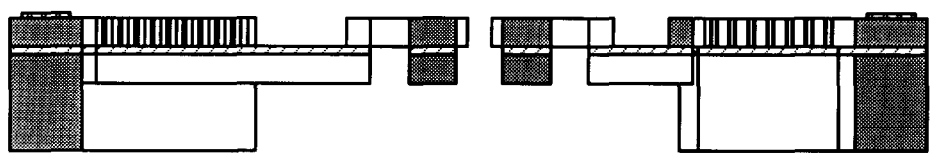
FIG. 2 is a cross sectional view of the microgripper corresponding to FIG. 1 along axis A-A.
Figure 3:
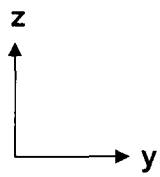
FIG. 3 is a cross sectional view of the microgripper corresponding to FIG. 1 along axis B-B.
Figure 3:
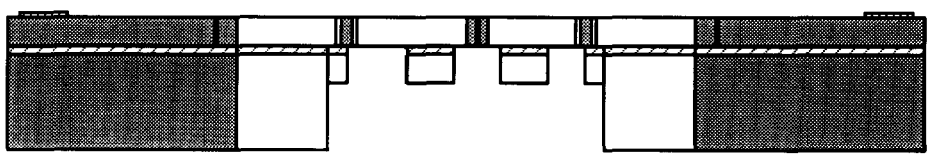

The length of microgripper arm L can be larger than 3.0 mm for the purpose of operating in an aqueous environment, such as for handling biological cells. To make the arms mechanically connected and electrically insulated, the gripper arms are preferably connected using the handle layer of an SOL (Silicon on Insulator) wafer as shown in FIGS. 2 and 3. The buried oxide layer, device layer, and handle layer are used together to form the structure and achieve electrical signal routing.

Figure 4:
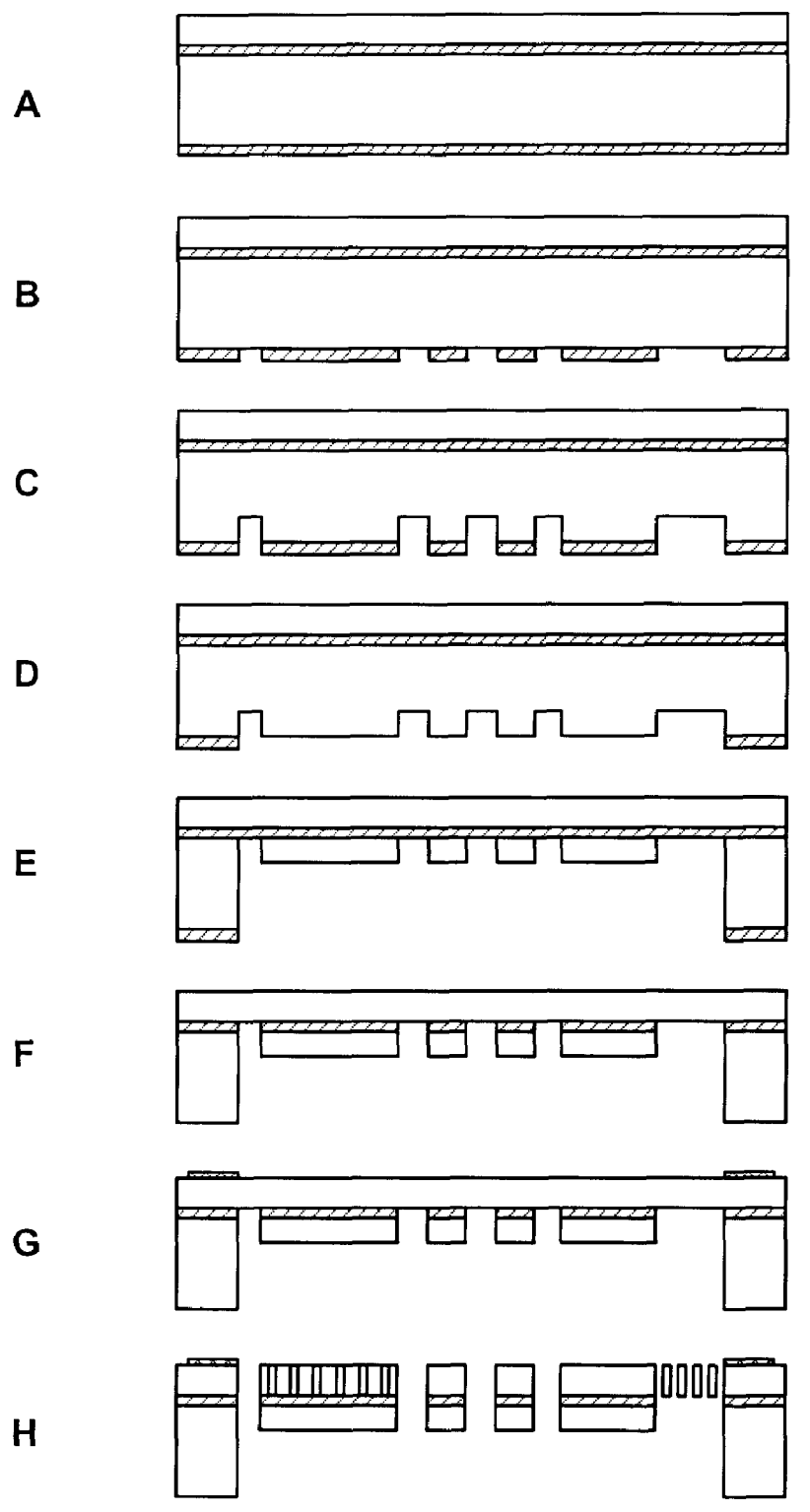
FIG. 4 illustrates microfabrication steps for the construction of a microgripper.

FIG. 4 shows a microfabrication process of the microgripper, as an example. According to application needs, an SOL wafer having a 200-500 µm thick handle layer, 1-2 µm thick $SiO_2$ and 0.5-300 µm thick device layer can be chosen, as an example. A total of 4 photolithography masks are required to construct the microgrippers.

In particular, the specific steps as illustrated include:
A) $SiO_2$ is deposited on the handle layer of SOI wafer.
B) $SiO_2$ is patterned to form DRIE (Deep Reactive Ion Etching) etch mask (mask 1).
C) Center part of photo resist is removed (mask 2) and handle layer of the wafer is etched up to 50 µm forming the structure for electrical insulation and mechanical connection.
D) Center part of $SiO_2$ is etched.
E) Handle layer of the wafer is etched again up to handle layer thickness minus up to half the thickness of the handle layer, e.g., 50 µm.
F) Buried oxide layer is etched.
G) Ohmic contacts are formed by e-beam evaporation and patterned by lift-off (mask 3).
H) Device layer of wafer is etched to form the structural elements thereof, including in this case gripper arms, flexures, bent-beam actuators, and comb drives (mask 4), for the microgripper of this example.

Note that changing the tethering spring dimensions and capacitance readout circuits can allow devices in accordance with the present invention to resolve forces down to pico-Newtons. Force resolution at this level enable a larger range of applications, particularly in nano device assembly and biophysics studies in which individual molecules are manipulated and characterized.

It should be understood that the present invention is the first of its kind in terms of actuation range for grasping a range of micro-nano objects and sensing forces along two axes. The stumbling block in this area has been the monolithic integration of both actuators and force sensors, but is achieved by the present invention. The present invention also provides for the novel de-coupling of force sensing along two axes.

It will be appreciated by those skilled in the art that other variations of the one or more embodiments described herein are possible and may be practised without departing from the scope of the present invention.

What is claimed is:

1. A gripping device fabricated by a microfabrication process incorporating photolithography masking being operable to grasp objects varying from micro to nanoNewton, and having two-axis force sensing capabilities, comprising:
    (a) two or more gripper arms including at least one driving arm and at least one sensing arm operable together to grasp any of the objects;
    (b) one or more microactuators connected to at least one of the two or more gripper arms and operable to deform and deflect the two or more gripper arms and to drive the at least one driving arm;
    (c) one or more force sensors connected to one or more of the two or more gripper arms including the at least one sensing arm, said one or more force sensors being operable with the at least one sensing arm and the at least one driving arm so that the one or more force sensors enable force sensing along two axes operable to measure gripping forces and forces applied at the end of the two or more gripper arms to a nanoNewton resolution, said axes include: (i) a longitudinal x-directional axis so that the gripping device is operable to generate force feedback relating to the at least one sensing arm and the at least one driving arm grasping any of the objects, said force feedback indicating detection of contact of the two or more gripping arms with any of the objects as contact feedback and tensile strength and adhesion force as gripping feedback, said force feedback being utilized by the gripping device to avoid breakage of the two or more gripper arms; and (ii) a lateral y-directional axis so that the gripping device is operable to generate displacement feedback relating to deformation and deflection of any of the two or more gripper arms; and
    (d) an insulator wafer handle layer connecting the two or more gripper arms to mechanically connect and electrically insulate the two or more gripper arms for operation in an aqueous environment.

2. The gripping device of claim 1 further characterised in that one or more of the microactuators are bent-beam electrothermal microactuators, U-beam electrothermal microactuators, or electrostatic microactuators.

3. The gripping device of claim 1 further characterised in that the force sensors are two-axis capacitive force sensors or piezoresistive force sensors.

4. The gripping device of claim 1 further characterised in that the force sensors are transverse differential capacitive comb drives.

5. The gripping device of claim 1 further characterised in that the gripper arms are connected to the microactuators by flexures.

6. The gripping device of claim 1 further characterised in that the gripper arms are connected to the force sensors by flexures.

7. The gripping device of claim 1 further characterised in that it is operable to grasp objects ranging from 1 nanometer to 500 microns.

8. The gripping device of claim 1 further characterised in that it is operable to measure the tensile strength or adhesion force of micro and nano objects by gripping and pulling.

9. The gripping device of claim 1 further characterised in that cross-axis coupling between two-axis force feedback is minimized.

10. The gripping device of claim 1 further characterised in that a silicon on insulator base material achieves electrical signal isolation between actuation paths and sensing paths.

11. The gripping device of claim 1 further characterized in that the gripping device further comprises capacitance readout circuits and a tethering spring of dimensions operable to resolve forces down to pico-Newtons.

12. A microgripping device operable to grasp objects varying from micro to nanoNewton and having two-axes force sensing capabilities, characterised in that the microgripping device comprises:
    (a) two or more gripper arms including at least one driving arm and at least one sensing arm operable together to grasp any of the objects;
    (b) one or more bent-beam electrothermal microactuators connected to the at least one of the gripper arms, said bent-beam electrothermal microactuators being operable to deform and deflect the two or more gripper arms and to drive the at least one driving arm;
    (c) one or more force sensors that are transverse differential capacitive comb drives operable to sense force enabling contact feedback and gripping feedback, said one or more force sensors being connected to the one or more of the two or more gripper arms including the at least one sensing arm, said one or more force sensors being operable with the at least one sensing arm and the at least one driving arm so that the one or more force sensors enable force sensing along two axes operable to measure gripping forces and forces applied at the end of the two or more gripper arms to a nanoNewton resolution, said axes include: (i) a longitudinal x-directional axis so that the gripping device is operable to generate force feedback relating to the at least one sensing arm and the at least one driving arm grasping any of the objects, said force feedback indicating detection of contact of the two or more gripping arms with any of the objects as contact feedback and tensile strength and adhesion force as gripping feedback, said force feedback being utilized by the gripping device to avoid breakage of the two or more gripper arms; and (ii) a lateral y-directional axis so that the gripping device is operable to generate displacement feedback relating to deformation and deflection of any of the two or more gripper arms; and
    (d) flexures connecting the microactuators with the gripper arms and connecting the force sensors with the gripper arms.

* * * * *